United States Patent
Seino et al.

(10) Patent No.: US 8,920,664 B2
(45) Date of Patent: Dec. 30, 2014

(54) PATTERN FORMING METHOD

(71) Applicant: Kabushiki Kaisha Toshiba, Tokyo (JP)

(72) Inventors: Yuriko Seino, Yokohama (JP); Hirokazu Kato, Yokohama (JP); Hiroki Yonemitsu, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 60 days.

(21) Appl. No.: 13/754,153

(22) Filed: Jan. 30, 2013

(65) Prior Publication Data

US 2014/0021166 A1    Jan. 23, 2014

(30) Foreign Application Priority Data

Jul. 18, 2012 (JP) ................. 2012-159555

(51) Int. Cl.
  *B44C 1/22* (2006.01)
  *B29C 59/14* (2006.01)
(52) U.S. Cl.
  CPC ...................... *B29C 59/14* (2013.01)
  USPC ................. 216/41; 216/48; 216/49; 438/736
(58) Field of Classification Search
  CPC ............ B81C 1/00031; B81C 1/00404; B81C 2201/0132; B81C 1/0396; B29C 59/14
  USPC ................. 216/41, 48, 49; 438/736
  See application file for complete search history.

(56) References Cited

U.S. PATENT DOCUMENTS

| | | | |
|---|---|---|---|
| 7,217,503 B2 | 5/2007 | Saitoh et al. | |
| 8,114,306 B2 | 2/2012 | Cheng et al. | |
| 2002/0177048 A1 | 11/2002 | Saitoh et al. | |
| 2005/0095513 A1 | 5/2005 | Yao et al. | |
| 2010/0297847 A1 | 11/2010 | Cheng et al. | |
| 2011/0070733 A1 | 3/2011 | Kikuchi et al. | |
| 2011/0143095 A1* | 6/2011 | Tada et al. | 428/156 |
| 2012/0231629 A1 | 9/2012 | Kikuchi et al. | |
| 2013/0105437 A1* | 5/2013 | Albrecht et al. | 216/22 |

FOREIGN PATENT DOCUMENTS

| | | |
|---|---|---|
| JP | 2003-234285 | 8/2003 |
| JP | 4190227 | 12/2008 |
| JP | 2010-269304 | 12/2010 |
| JP | 2011-80087 | 4/2011 |
| JP | 4823346 | 11/2011 |
| JP | 2012-5939 | 1/2012 |
| JP | 2012-33534 | 2/2012 |

* cited by examiner

*Primary Examiner* — Binh X Tran

(74) *Attorney, Agent, or Firm* — Finnegan, Henderson, Farabow, Garrett & Dunner, L.L.P.

(57) ABSTRACT

According to one embodiment, a pattern forming method includes forming a physical guide that includes a first predetermined pattern in a first region on a lower layer film, and includes a second predetermined pattern and a dummy pattern in a second region on the lower layer film, forming a block polymer inside the physical guide, making the block polymer microphase-separated to form a pattern having a first polymer section and a second polymer section, removing the second polymer section to form a hole pattern, and processing the lower layer film after removal of the second polymer section, with the physical guide and the first polymer section used as a mask. Shapes of the hole patterns in the first and the second predetermined patterns are transferred to the lower layer film. A shape of the hole pattern in the dummy pattern is not transferred to the lower layer film.

8 Claims, 6 Drawing Sheets

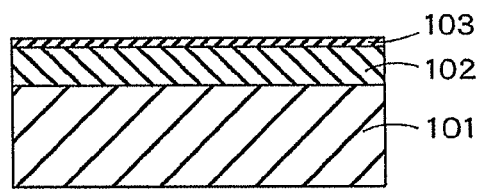
F I G. 1
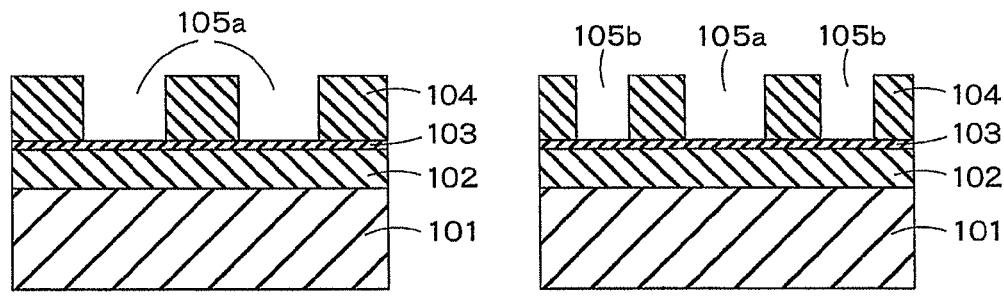
F I G. 2A        F I G. 2B
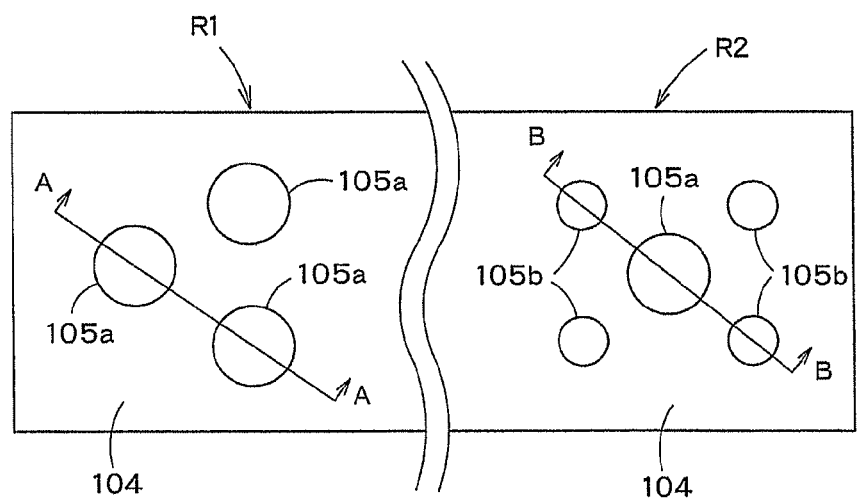
F I G. 3

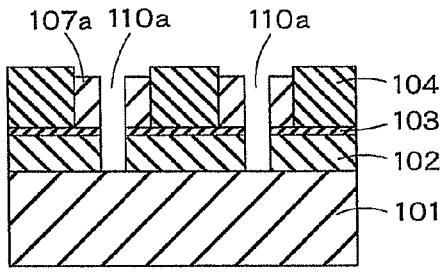
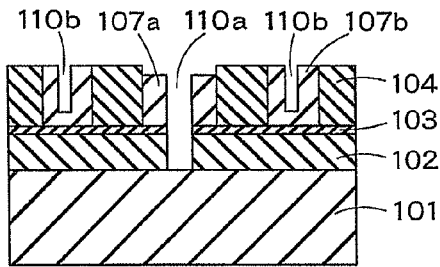
F I G. 7A  F I G. 7B
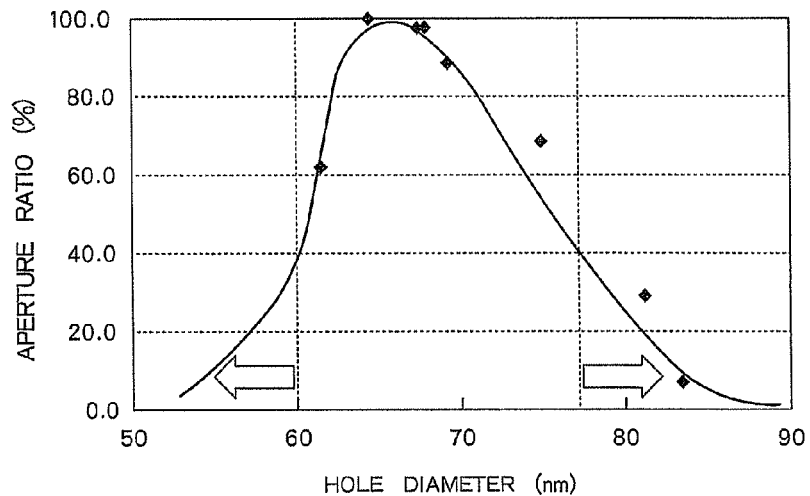
F I G. 8
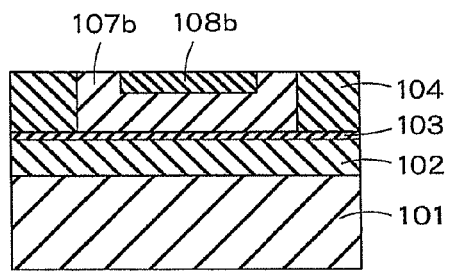
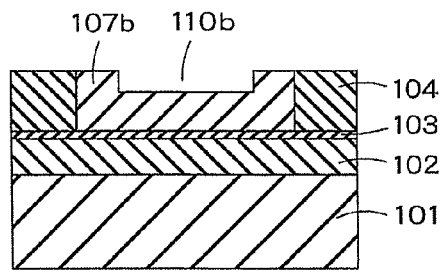
F I G. 9A  F I G. 9B

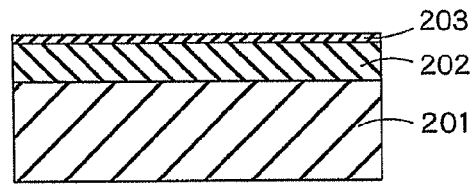
F I G. 10
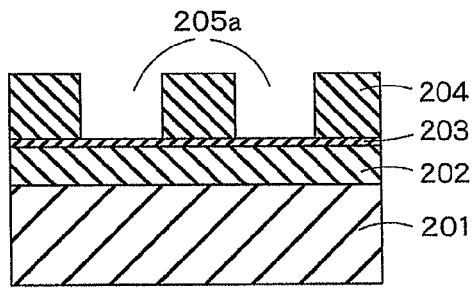
F I G. 11A
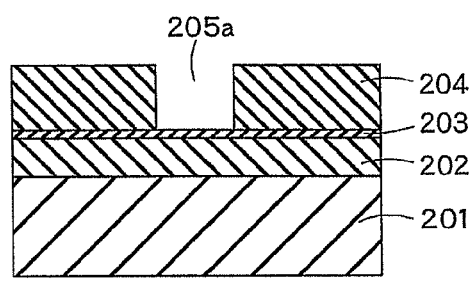
F I G. 11B
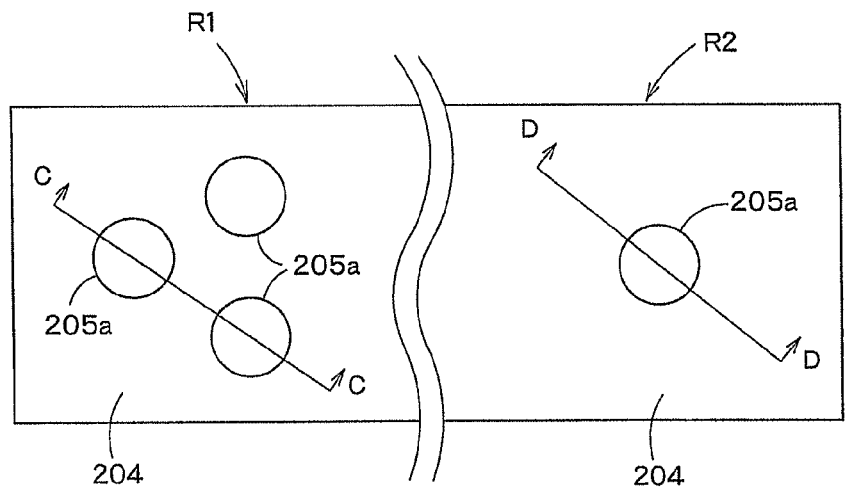
F I G. 12

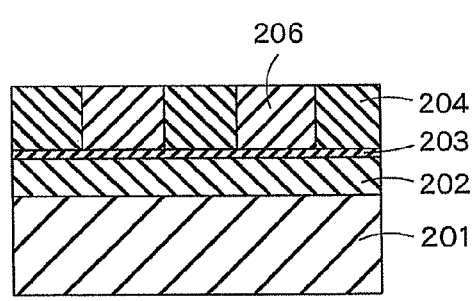
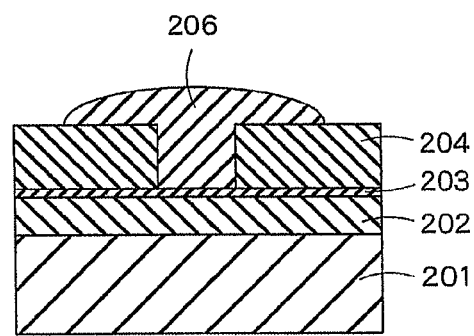
F I G. 13A          F I G. 13B
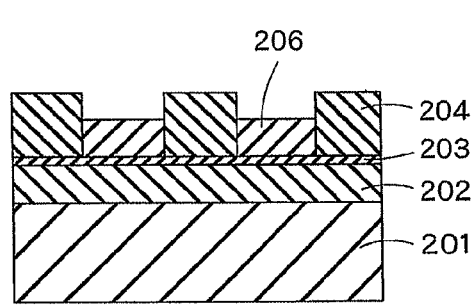
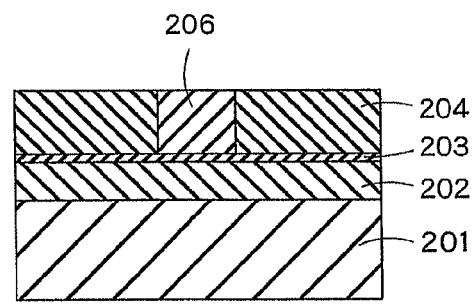
F I G. 14A          F I G. 14B

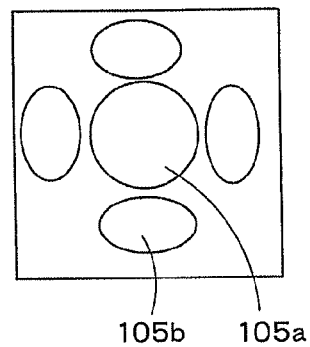 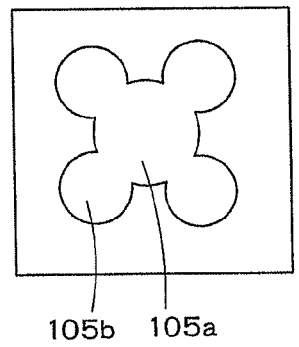
F I G. 15A    F I G. 15B
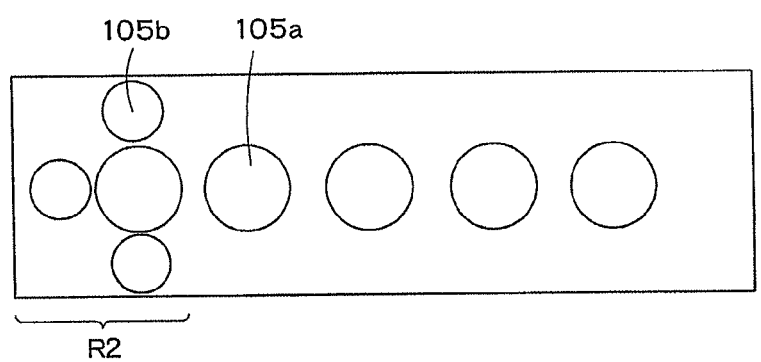
F I G. 16

PATTERN FORMING METHOD

CROSS REFERENCE TO RELATED APPLICATION

This application is based upon and claims benefit of priority from the Japanese Patent Application No. 2012-159555, filed on Jul. 18, 2012, the entire contents of which are incorporated herein by reference.

FIELD

Embodiments described herein relate generally to a pattern forming method.

BACKGROUND

As a lithography technique in a semiconductor element manufacturing process, a double patterning technique by ArF-immersion exposure, EUV lithography, nanoimprinting and the like are known. A conventional lithography technique has held a variety of problems such as a cost increase and through-put deterioration, which have occurred with finer pattern processing.

Under such circumstances, application of directed self-assembly (DSA) to the lithography technique has been expected. Since DSA is generated by a voluntary behavior such as energy stabilization, a pattern with high dimensional accuracy can be formed. Especially, a technique of using microphase separation of a high-polymer block copolymer enables formation of periodic structures in a variety of shapes of several nm to several hundred nm by means of simple coating and an anneal process. The high-polymer block copolymer can be changed in shape to a spherical shape, a cylindrical shape, a lamella shape or the like in accordance with a composition ratio of blocks, and can be changed in size in accordance with a molecular weight, thereby forming a dot pattern, a hole or pillar pattern, line patterns or the like with a variety of dimensions.

Formation of a desired pattern in a broad range by use of DSA requires provision of a guide for controlling a generating location of a polymer phase formed by DSA. There are known as the guide a physical guide (grapho-epitaxy) that has a concavo-convex structure and forms a microphase separation pattern in its concave section, and a chemical guide (chemical-epitaxy) that is formed in a lower layer of the DSA material and controls, based on a difference in its surface energy, a forming location of the microphase separation pattern.

For example, a resist film is formed on a film to be processed, and a hole pattern to serve as the physical guide is formed in this resist film by photolithography. Coating of a block copolymer is applied so as to be embedded into the inside of the hole pattern, and then heated. This leads to microphase separation of the block copolymer into a first polymer section formed along a side wall of the hole pattern and a second polymer section formed in a midsection of the hole pattern. Subsequently, the second polymer section is selectively removed by irradiation with oxygen plasma, thereby to obtain a hole pattern reduced from the hole pattern formed in the resist film by photolithography. Then the film to be processed is processed using the resist film and the first polymer section as a mask.

However, when coating of the block copolymer is applied such that the block copolymer is appropriately embedded into the hole pattern, serving as the physical guide, in a region with a high pattern density of the hole pattern, the block copolymer is flooded from the hole pattern in a region with a low pattern density, and it has thus been not possible to obtain a desired microphase separation pattern. Conversely, when coating of the block copolymer is applied such that the block copolymer is appropriately embedded into the hole pattern in the region with a low pattern density, the block copolymer is not sufficiently embedded into the inside of the hole pattern in the region with a high pattern density, leading to formation of a microphase separation pattern with a small film thickness, and it has thus been not possible to obtain sufficient processing resistance.

BRIEF DESCRIPTION OF THE DRAWINGS

FIG. 1 is a process sectional view for explaining a pattern forming method according to an embodiment of the present invention;

FIGS. 2A and 2B are process sectional views subsequent to FIG. 1;

FIG. 3 is a view showing an example of a hole pattern;

FIGS. 7A and 7B are process sectional views subsequent to FIGS. 6A and 6B;

FIG. 8 is a graph showing the relation between a diameter of the hole pattern and an aperture ratio of a pattern to be transferred to a lower layer;

FIGS. 9A and 9B are sectional views showing an example of the hole pattern;

FIG. 10 is a process sectional view for explaining a pattern forming method according to a comparative example;

FIGS. 11A and 11B are process sectional views subsequent to FIG. 10;

FIG. 12 is a view showing a hole pattern in the comparative example;

FIGS. 13A and 13B are process sectional views subsequent to FIGS. 11A and 11B;

FIGS. 14A and 14B are process sectional views subsequent to FIGS. 11A and 11B;

FIGS. 15A and 15B are views showing an example of the hole pattern; and

FIG. 16 is a view showing an example of the hole pattern.

DETAILED DESCRIPTION

Figure 4A:
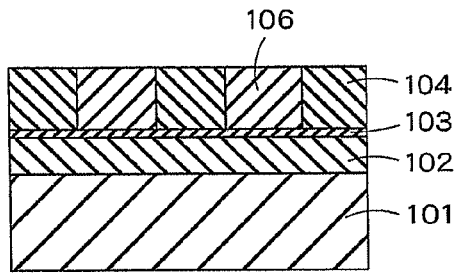
FIGS. 4A and 4B are process sectional views subsequent to FIGS. 2A and 2B.

According to one embodiment, a pattern forming method includes forming a physical guide that includes a first predetermined pattern in a first region on a lower layer film, and includes a second predetermined pattern and a dummy pattern in a second region on the lower layer film, forming a block polymer inside the physical guide, making the block polymer microphase-separated to form a pattern having a first polymer section and a second polymer section, removing the second polymer section to form a hole pattern, and processing the lower layer film after removal of the second polymer section, with the physical guide and the first polymer section used as a mask. Shapes of the hole patterns in the first predetermined pattern and the second predetermined pattern are transferred to the lower layer film. A shape of the hole pattern in the dummy pattern is not transferred to the lower layer film.

Embodiments will now be explained with reference to the accompanying drawings.

A pattern forming method according to the present embodiment will be described using FIGS. 1 to 7. FIGS. 1, 2 and 4 to 7 are longitudinal sectional views, and FIG. 3 is a top view.

First, as shown in FIG. 1, a hard mask 102 and a reflection preventive film 103 are sequentially formed on a film 101 to be processed. The film 101 to be processed is an oxide film having a film thickness of 300 nm, for example. The hard mask 102 is a carbon film having a film thickness of 100 nm and formed using CVD (chemical-vapor deposition), for example. Further, the reflection preventive film 103 is an oxide film having a film thickness of 15 nm and formed using CVD, for example.

Next, as shown in FIGS. 2A, 2B and 3, a resist film 104 having a film thickness of 120 nm is spin-coated onto the reflection preventive film 103, which is then exposed to light with an exposure amount of 20 mJ/cm$^2$ by an ArF-immersion excimer laser and developed, thereby forming circular hole patterns 105a and 105b in the resist film 104. A diameter of the hole pattern 105a is 70 nm, for example, and a diameter of the hole pattern 105b is 55 nm, for example. Ranges of values that can be taken as the diameters of the hole patterns 105a and 105b will be described later.

The hole pattern 105a has a function to serve as a physical guide layer at the time of microphase separation of a block polymer that will be formed in a subsequent process. A microphase separation pattern formed inside the hole pattern 105a includes a pattern to be transferred to the film 101 to be processed.

Meanwhile, the hole pattern 105b is a dummy pattern for adjusting a coverage ratio (or aperture ratio), and as shown in FIG. 3, it is formed in the vicinity of the hole pattern 105a in a loose pattern region R2 with a small number of hole patterns 105a. Thereby, the coverage ratios (or aperture ratios) of a dense pattern region R1 with a large number of hole patterns 105a and the loose pattern region R2 can be made at the same level.

It can be said here that the dense pattern region R1 is a region with the resist film 104 having a lower coverage ratio (higher aperture ratio) than the loose pattern region R2 in the case of not forming the dummy hole pattern 105b. Further in the case of regarding the pattern that is transferred to the film 101 to be processed as a standard, it can be said that the dense pattern region R1 is a region with a higher pattern density than the loose pattern region R2.

A cross section along a line A-A in the dense pattern region R1 of FIG. 3 corresponds to FIG. 2A, and a cross section along a line B-B in the loose pattern region R2 corresponds to FIG. 2B. Further, FIGS. 4A, 5A, 6A, and 7A correspond to the cross section along the line A-A, and FIGS. 4B, 5B, 6B, and 7B correspond to the cross section along the line B-B.

Figure 4B:
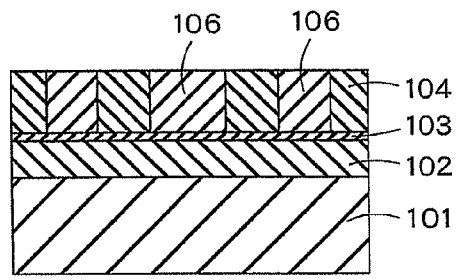

Next, as shown in FIGS. 4A and 4B, coating of a block polymer 106 is applied onto the resist film 104. A random copolymer (PS-b-PMMA) of polyethylene (PS) and polymethyl methacrylate (PMMA), with a number average molecular weight (Mn) of the PS block/PMMA block being 4700/24000, is prepared and a solution of polyethylene glycol monoethyl ether acetate (PGMEA) containing the copolymer with a concentration of 1.0 wt % is spin-coated onto the resist film 104 at a revolution speed of 2000 rpm. Thereby, a block polymer 106 is embedded into the inside of the hole patterns 105a and 105b.

As shown in FIG. 4B, since the hole patterns 105b as the dummy pattern for adjusting an aperture ratio are provided in the loose pattern region R2 with a small number of hole patterns 105a, it is possible to prevent the block polymer 106 from being flooded from the hole pattern 105a.

Figure 5A:
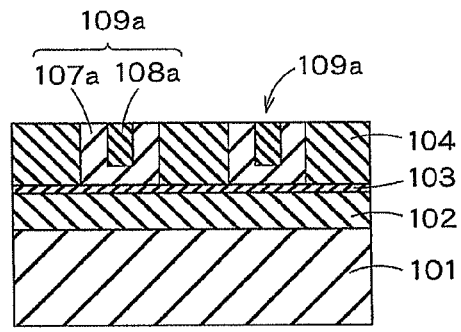
FIGS. 5A and 5B are process sectional views subsequent to FIGS. 4A and 4B.
Figure 5B:
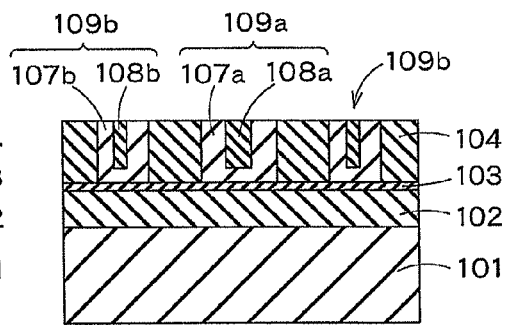

Next, as shown in FIGS. 5A and 5B, the laminated body is placed on a hot plate and heated at 110° C. for 90 seconds, and further heated at 220° C. for 3 minutes in a nitrogen atmosphere. Thereby, the block polymer 106 is microphase-separated to form DSA phases 109a and 109b that include first polymer sections 107a and 107b including first polymer block chains and second polymer sections 108a and 108b including second polymer block chains. For example, the first polymer sections 107a and 107b are formed (segregated) in side wall sections and bottom sections of the hole patterns 105a and 105b, and the second polymer sections 108a and 108b containing PMMA are formed in midsections of the hole patterns 105a and 105b. For example, a diameter of the second polymer section 108a is 30 nm, and a diameter of the second polymer section 108b is 20 nm.

Figure 6A:
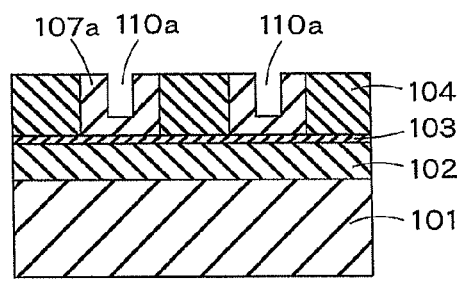
FIGS. 6A and 6B are process sectional views subsequent to FIGS. 5A and 5B.
Figure 6B:
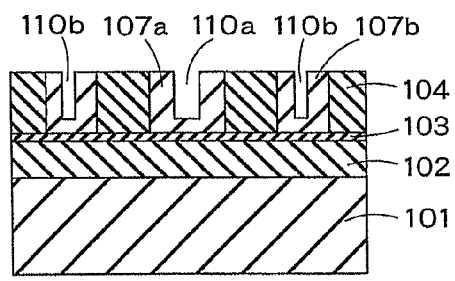

Next, as shown in FIGS. 6A and 6B, the first polymer sections 107a and 107b are made to remain while the second polymer sections 108a and 108b are selectively removed by oxygen RIE (reactive ion etching), thereby forming hole patterns 110a and 110b. For example, the hole pattern 110a has a diameter of 30 nm and corresponds to one contracted from the hole pattern 105a The hole pattern 110b has a diameter of 20 nm, and corresponds to one contracted from the hole pattern 105b.

Next, as shown in FIG. 7A, 7B, the first polymer sections 107a and 107b having been made to remain and the resist film 104 are used as a mask, and the reflection preventive film 103 and the hard mask 102 are processed by RIE using fluorine gas. At this time, the hole pattern 110a is transferred to the reflection preventive film 103 and the hard mask 102, whereas the hole pattern 110b is not transferred to the reflection preventive film 103 and the hard mask 102.

The hole pattern 110a has a larger diameter than that of the hole pattern 110b, and etching gas sufficiently reaches via the hole pattern 110a, allowing removal of the first polymer section 107a in a lower part of the hole pattern 110a. For this reason, the hole pattern 110a is transferred to the reflection preventive film 103 and the hard mask 102.

On the other hand, the hole pattern 110b has a small diameter, and etching gas is not sufficiently distributed downward via the hole pattern 110b. For this reason, the hole pattern 110b is not transferred to the reflection preventive film 103 and the hard mask 102.

Then the first polymer sections 107a and 107b and the resist film 104 are removed, and the film 101 to be processed is processed using the hard mask 102 as a mask.

Next there will be described diameters of the hole pattern 105a and the dummy hole pattern 105b formed in the resist film 104 in the processes illustrated in FIGS. 2A, 2B and 3.

FIG. 8 is a graph showing the relation between a size of the hole pattern formed in the resist film 104 and an aperture ratio of a pattern to be transferred to the hard mask 102 with respect to the hole pattern 110a (110b) formed by selectively removing the second polymer section 108a (108b). For example, when an aperture ratio of not higher than 40% is regarded as a state where "the pattern is not transferred", it is found from FIG. 8 that the diameter of the dummy hole pattern 105b should be made smaller than 60 nm or larger than 76 nm.

When the diameter of the dummy hole pattern 105b is smaller than 60 nm, as shown in FIGS. 6B and 7B, the first polymer section 107b below the hole pattern 110b is not sufficiently removed, and the pattern is hardly transferred to the hard mask 102.

Further, when the diameter of the dummy hole pattern 105b is larger than 76 nm, as shown in FIG. 9A, the second polymer section 108b is formed with a small thickness in the midsection of the dummy hole pattern 105b, and the first polymer section 107b in the bottom section of the dummy hole pattern 105b has a large film thickness. As shown fin FIG. 9B, even when such a second polymer section 108b is selectively removed to form the hole pattern 110b, the first polymer section 107b below the hole pattern 110b is not sufficiently removed in a subsequent RIE process using fluorine gas, and the pattern is hardly transferred to the hard mask 102.

Accordingly, the diameter of the dummy hole pattern 105b formed in the resist film 104 in the processes illustrated in FIGS. 2A, 2B and 3 is preferably made smaller than 60 nm or larger than 76 nm. On the other hand, the diameter of the hole pattern 105a is preferably made not larger than 60 nm and not smaller than 76 nm.

As thus described, according to the present embodiment, the dummy hole pattern 105b for adjusting an aperture ratio, which has such a size that the pattern is not transferred to the lower layer film, is formed in the loose pattern region R2 with a small number of hole patterns 105a, thereby allowing formation of an appropriate amount of block polymer 106 inside the hole pattern 105a in the loose pattern region R2. This can lead to formation of the microphase separation pattern with desired film thickness and shape even when there is a difference in denseness (difference in aperture ratio) of the hole patterns 105a which are to serve as the physical guide depending on the regions.

Comparative Example

A pattern forming method according to a comparative example will be described using FIGS. 10 to 14. FIGS. 10, 11, 13 and 14 are longitudinal sectional views, and FIG. 12 is a top view.

First, as shown in FIG. 10, a hard mask 202 and a reflection preventive film 203 are sequentially formed on a film 201 to be processed. For the film 201 to be processed, the hard mask 202 and the reflection preventive film 203, similar materials to those for the film 101 to be processed, the hard mask 102 and the reflection preventive film 103 in the above first embodiment are respectively used.

Next, as shown in FIGS. 11A, 11B and 12, a resist film 204 is spin-coated onto the reflection preventive film 203, which is then exposed to light and developed, to form a hole pattern 205a in the resist film 204. A diameter of the hole pattern 205a is 70 nm, for example.

The hole pattern 205a has a function to serve as a physical guide layer at the time of microphase separation of a block polymer that will be formed in a subsequent process.

As shown in FIG. 12, a region R2 is a loose pattern region with a small number of hole patterns 205a as compared with the region R1. There is a difference in coverage ratio (or aperture ratio) between the dense pattern region R1 with a large number of hole patterns 205a and the loose pattern region R2.

It is to be noted that a cross section along a line C-C in the dense pattern region R1 of FIG. 12 corresponds to FIG. 11A, and a cross section along a line D-D in the loose pattern region R2 corresponds to FIG. 11B. Further, FIGS. 13A and 14A correspond to the cross section along the line C-C, and FIGS. 13B and 14B correspond to the cross section along the line D-D.

Next, as shown in FIGS. 13A and 13B, coating of a block polymer 206 is applied onto the resist film 204. A random copolymer (PS-b-PMMA) of polyethylene (PS) and polymethyl methacrylate (PMMA), with a number average molecular weight (Mn) of the PS block/PMMA block being $^{4700}/_{24000}$, is prepared and a solution of polyethylene glycol monoethyl ether acetate (PGMEA) containing the copolymer with a concentration of 1.0 wt % is spin-coated onto the resist film 204 at a revolution speed of 2000 rpm.

As shown in FIG. 13A, when coating of the block polymer 206 is applied such that an appropriate amount of the block polymer 206 is embedded into the inside of the hole pattern 205a in the dense pattern region R1, the block copolymer 206 is flooded from the hole pattern 205a in the loose pattern region R2 as shown in FIG. 13B.

When the block polymer 206 is microphase-separated by heating in a subsequent process, a desired microphase separation pattern cannot be obtained in the loose pattern region R2 where the block copolymer 206 is flooded from the hole pattern 205a.

On the contrary, when coating of the block polymer 206 is applied such that an appropriate amount of the block polymer 206 is embedded into the inside of the hole pattern 205a in the loose pattern region R2 as shown in FIG. 14B, the block copolymer 206 that is embedded into the inside of the hole pattern 205a is small in amount in the dense pattern region R1 as shown in FIG. 14A. When the block polymer 206 is microphase-separated by heating in a subsequent process, a microphase separation pattern formed in the dense pattern region R1 has a small film thickness, and sufficient processing resistance cannot be obtained.

On the other hand, according to the foregoing present embodiment, the dummy hole pattern 105b for adjusting an aperture ratio, which has such a size that the pattern is not transferred to the lower layer film, is formed in the loose pattern region R2 with a small number of hole patterns 105a, whereby it is possible to prevent the block polymer 106 from being flooded from the hole pattern 105a in the loose pattern region R2. Accordingly, an appropriate amount of block polymer 106 can be formed inside the hole pattern 105a both in the dense pattern region R1 and the loose pattern region R2. Hence it is possible to form the microphase separation pattern with desired film thickness and shape even when there is a difference in denseness (difference in aperture ratio) of the hole patterns 105a.

Although the dummy hole pattern 105b has been formed in the circular shape in the above embodiment, it may be formed in an elliptical shape as shown in FIG. 15A. Further, the dummy hole pattern 105b may be connected with the hole pattern 105a as shown in FIG. 15B so long as a desired microphase separation pattern is obtained.

Moreover, as shown in FIG. 16, the dummy hole pattern 105b may be formed as a terminal portion of a successive pattern formed by successive provision of a plurality of same patterns is regarded as the loose pattern region R2. At this time, a portion other than the terminal portion is regarded as the dense pattern region R1.

Further, the dummy hole pattern 105b may not pass through the resist film 104. That is, a height of the dummy hole pattern 105b may be smaller than a film thickness of the resist film 104.

Although the resist pattern to serve as the physical guide has been formed by ArF-immersion exposure in the above embodiment, it may be formed by a photolithography method such as EUV or nanoimprinting.

Further, not the resist pattern but the hard mask transferred with this pattern may be used as the physical guide. In this case, the film 101 to be processed is processed using the first polymer sections 107a and 107b and the hard mask as the mask.

Further, although the first polymer sections 107a and 107b have been formed in the side wall sections and the bottom sections of the hole patterns 105a and 105b in the above embodiment, the first polymer sections 107a and 107b may be formed only in the side wall sections of the hole patterns 105a and 105b.

Moreover, although the case of forming the hole pattern has been described in the above embodiment, a line pattern may be formed. In this case, the physical guide has a rectangular shape, and a material to be microphase-separated in a lamella shape is used for the block polymer.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A pattern forming method, comprising:
    forming a physical guide that includes a first predetermined pattern in a first region on a lower layer film, and includes a second predetermined pattern and a dummy pattern in a second region on the lower layer film;
    forming a block polymer inside the physical guide;
    making the block polymer microphase-separated to form a pattern having a first polymer section and a second polymer section;
    removing the second polymer section to form a hole pattern;
    processing the lower layer film after removal of the second polymer section, with the physical guide and the first polymer section used as a mask, and
    transferring shapes of the hole patterns in the first predetermined pattern and the second predetermined pattern to the lower layer film while not transferring a shape of the hole pattern in the dummy pattern to the lower layer film, by the processing of the lower layer film,
    wherein the first predetermined pattern, the second predetermined pattern and the dummy pattern respectively have hole shapes, and a diameter of the dummy pattern is smaller than 60 nm or larger than 76 nm,
    the first polymer section is formed on side wall surfaces and bottom surfaces of the first predetermined pattern, the second predetermined pattern and the dummy pattern,
    the second polymer section is formed in midsections of the first predetermined pattern, the second predetermined pattern and the dummy pattern, and surrounded by the first polymer section,
    the dummy pattern is connected with the second redetermined pattern, and
    wherein the lower layer film is a hard mask and a reflection preventive film formed on a film to be processed,
    a resist film is formed on the reflection preventive film, and the resist film is patterned by photolithography to form the physical guide, and
    the physical guide is formed on the reflection preventive film by an imprinting process.

2. The pattern forming method according to claim 1, wherein diameters of the first predetermined pattern and the second predetermined pattern are not smaller than 60 nm and not larger than 76 nm.

3. The pattern forming method according to claim 1, wherein the dummy pattern has a circular shape or an elliptical shape.

4. The pattern forming method according to claim 1, wherein the block polymer contains a random copolymer of polyethylene and polymethyl methacrylate.

5. The pattern forming method according to claim 1, wherein forming the block polymer inside the physical guide leads to embedment of a predetermined amount of the block polymer into the insides of the first predetermined pattern and the second predetermined pattern.

6. The pattern forming method according to claim 1, wherein a pattern density of a pattern to be transferred to the lower layer film in the first region is higher than a pattern density of a pattern to be transferred to the lower layer film in the second region.

7. The pattern forming method according to claim 1, wherein
    the first predetermined pattern is a successive pattern formed by successive provision of a plurality of same patterns, and
    the second predetermined pattern corresponds to a terminal portion of the successive pattern.

8. A pattern forming method, comprising:
    forming a physical guide that includes a plurality of first predetermined patterns in a first region on a lower layer film, and includes a second predetermined pattern and a dummy pattern in a second region on the lower layer film;
    forming a block polymer inside the physical guide;
    making the block polymer microphase-separated to form a pattern having a first polymer section and a second polymer section;
    removing the second polymer section to form a hole pattern;
    processing the lower layer film after removal of the second polymer section, with the physical guide and the first polymer section used as a mask, and
    transferring shapes of the hole patterns in the first predetermined pattern and the second predetermined pattern to the lower layer film while not transferring a shape of the hole pattern in the dummy pattern to the lower layer film, by the processing of the lower layer film,
    wherein the first predetermined pattern, the second predetermined pattern and the dummy pattern respectively have hole shapes, and a diameter of the dummy pattern is smaller than 60 nm,
    the first polymer section is formed on side wall surfaces and bottom surfaces of the first predetermined pattern, the second predetermined pattern and the dummy pattern,
    the second polymer section is formed in midsections of the first predetermined pattern, the second predetermined pattern and the dummy pattern, and surrounded by the first polymer section,
    the lower layer film is a hard mask and a reflection preventive film armed on a film to be processed,
    a resist film is formed on the reflection preventive film, and the resist film is patterned by photolithography to form the physical guide,
    the physical guide is formed on the reflection preventive film by an imprinting process, and
    the plurality of first predetermined patterns in the first region and the second predetermined pattern in the second region form a successive pattern, and the second region is a terminal portion of the successive pattern.

* * * * *